United States Patent
Lokken et al.

(10) Patent No.: US 9,931,257 B2
(45) Date of Patent: Apr. 3, 2018

(54) STANDING FRAME WITH MULTI-ANGLE POSITIONING WHILE MAINTAINING USER ORIENTATION

(71) Applicant: Altimate Medical, Inc., Morton, MN (US)

(72) Inventors: Michael Lokken, Grove City, MN (US); Matthew Haugen, Hector, MN (US); Jeffrey Schmidt, Redwood Falls, MN (US); Travis Fluck, Redwood Falls, MN (US); Wesley Ovre, Redwood Falls, MN (US); Nancy Perlich, Eden Prairie, MN (US); Mark Schmitt, Atwater, MN (US); Andrew Gardeen, Olivia, MN (US)

(73) Assignee: Altimate Medical, Inc., Morton, MN (US)

( * ) Notice: Subject to any disclaimer, the term of this patent is extended or adjusted under 35 U.S.C. 154(b) by 763 days.

(21) Appl. No.: 14/327,943

(22) Filed: Jul. 10, 2014

(65) Prior Publication Data
US 2016/0008195 A1    Jan. 14, 2016

(51) Int. Cl.
| A61G 7/005 | (2006.01) |
| A61G 5/14 | (2006.01) |
| A61G 7/053 | (2006.01) |
| A61G 5/00 | (2006.01) |
| A61G 5/10 | (2006.01) |
| G01R 33/30 | (2006.01) |

(52) U.S. Cl.
CPC .............. *A61G 7/005* (2013.01); *A61G 5/00* (2013.01); *A61G 5/1091* (2016.11); *A61G 5/1094* (2016.11); *A61G 5/14* (2013.01); *A61G 7/053* (2013.01); *G01R 33/30* (2013.01); *Y10S 297/10* (2013.01)

(58) Field of Classification Search
USPC .......... 324/300–322, 5; 600/407–435, 250.1; 5/610, 601; 606/244; 602/5; 280/250.1
See application file for complete search history.

(56) References Cited

U.S. PATENT DOCUMENTS

| 2,968,843 | A | * | 1/1961 | Fording | ................. A47C 1/126 297/243 |
| 4,508,387 | A | * | 4/1985 | Gilbert | ................... A61G 13/12 297/423.19 |
| 5,489,258 | A | * | 2/1996 | Wohnsen | ................. A61G 5/14 5/610 |
| 5,836,652 | A | * | 11/1998 | Wexler | ................... A47C 7/506 297/423.26 |

(Continued)

OTHER PUBLICATIONS

Search Report from European Application No. 15176196.2 dated Nov. 19, 2015 (7 pages).

*Primary Examiner* — Melissa Koval
*Assistant Examiner* — Tiffany Fetzner
(74) *Attorney, Agent, or Firm* — Calfee, Halter & Griswold LLP

(57) ABSTRACT

An apparatus is disclosed as having, for example, a frame, a support assembly, and a pivot joint pivotably connected to the frame and the support assembly for positioning in a plurality of modes including, for example, a user in supine, standing, and/or prone positions. The apparatus may be positioned within various ranges that include supine and prone modes without re-configuring the apparatus.

19 Claims, 13 Drawing Sheets

(56) References Cited

U.S. PATENT DOCUMENTS

| | | | | |
|---|---|---|---|---|
| 7,645,215 | B2* | 1/2010 | Gordon | A63B 21/155 |
| | | | | 482/51 |
| 7,833,134 | B2* | 11/2010 | Gordon | A63B 22/0017 |
| | | | | 482/51 |
| 7,944,208 | B2* | 5/2011 | Dutto | A61B 5/0555 |
| | | | | 324/307 |
| 2007/0037667 | A1* | 2/2007 | Gordon | A63B 21/155 |
| | | | | 482/51 |
| 2009/0021057 | A1 | 1/2009 | Erb et al. | |
| 2009/0289633 | A1* | 11/2009 | Dutto | A61B 5/0555 |
| | | | | 324/321 |
| 2010/0152001 | A1* | 6/2010 | Gordon | A63B 21/155 |
| | | | | 482/53 |
| 2012/0324648 | A1* | 12/2012 | Amano | A61B 6/037 |
| | | | | 5/601 |
| 2016/0008195 | A1* | 1/2016 | Lokken | A61G 7/005 |
| | | | | 5/610 |

* cited by examiner

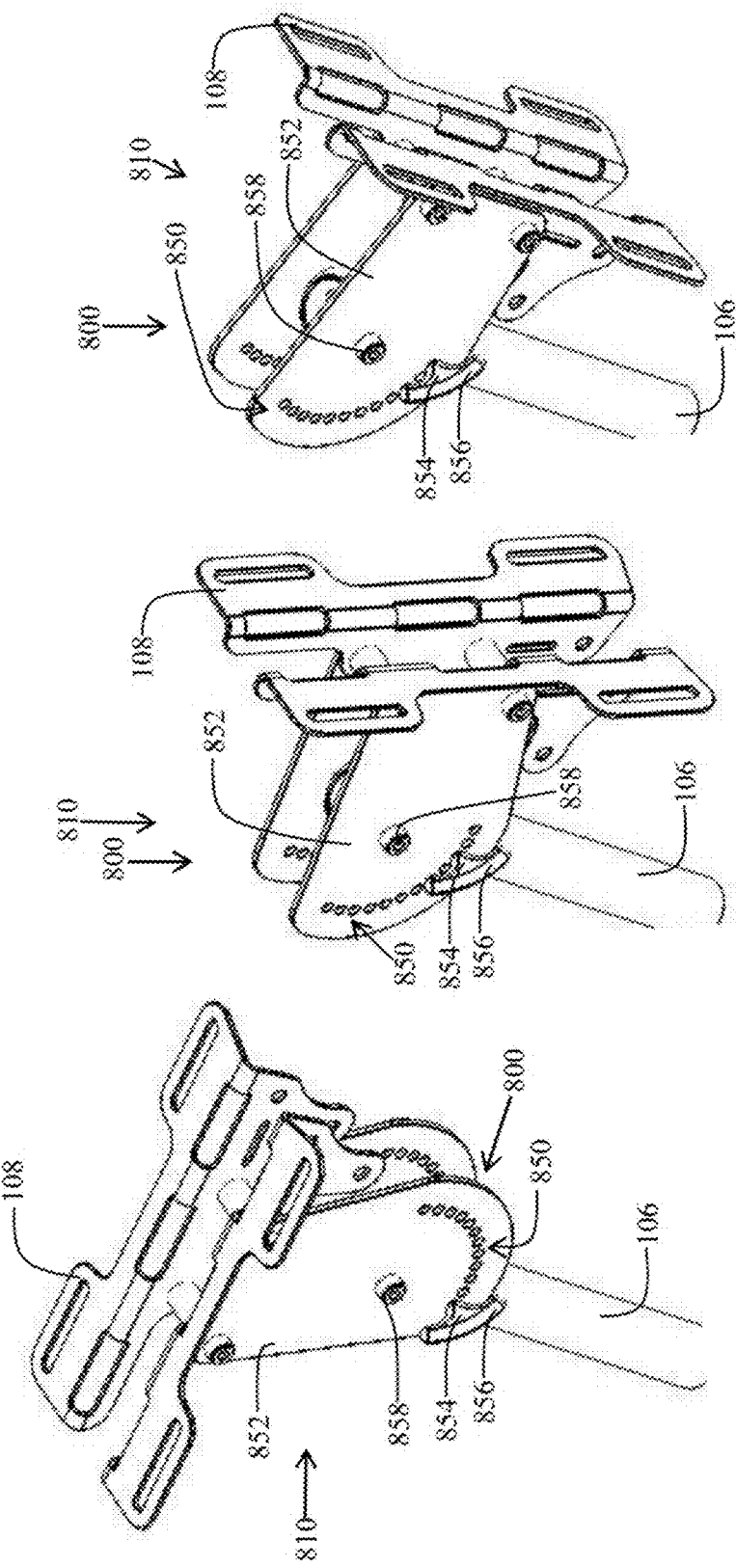

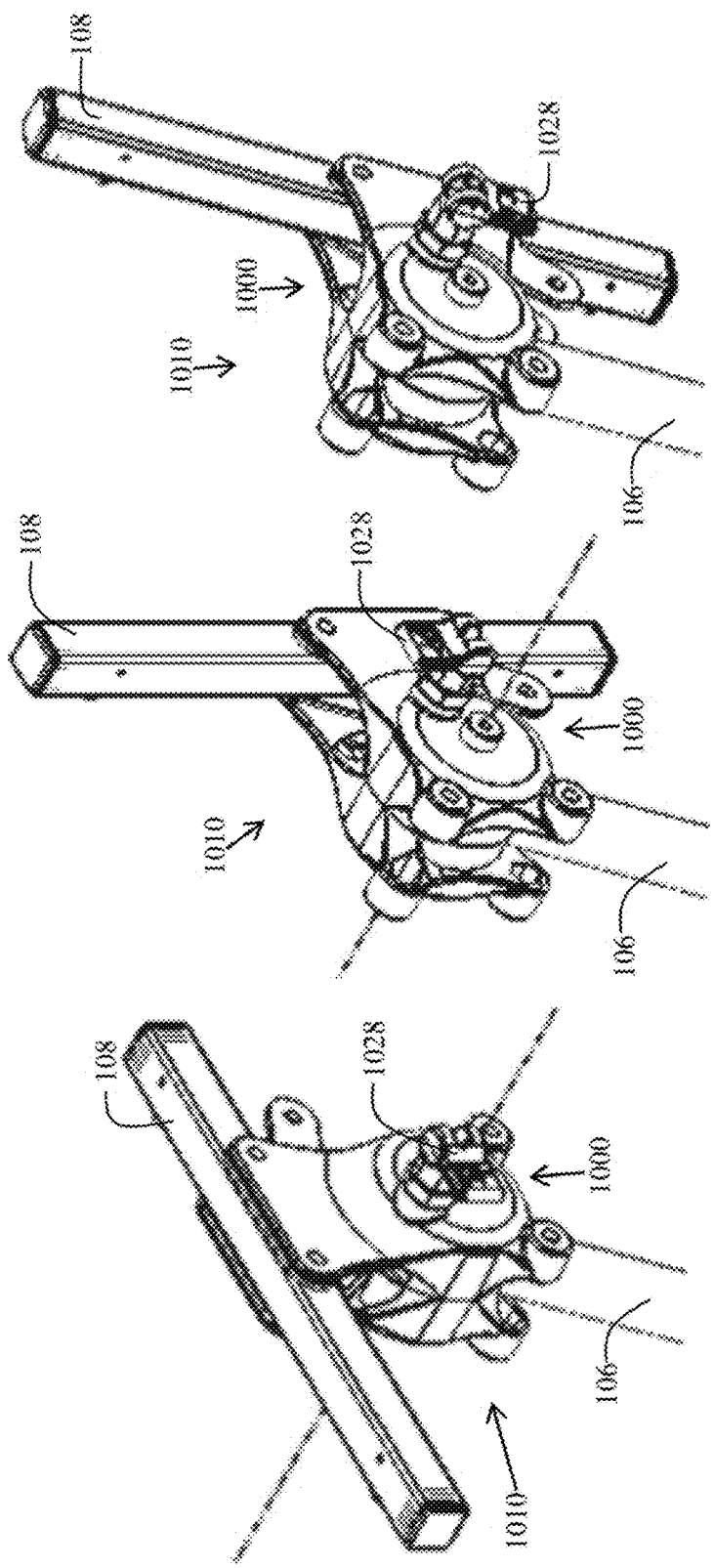

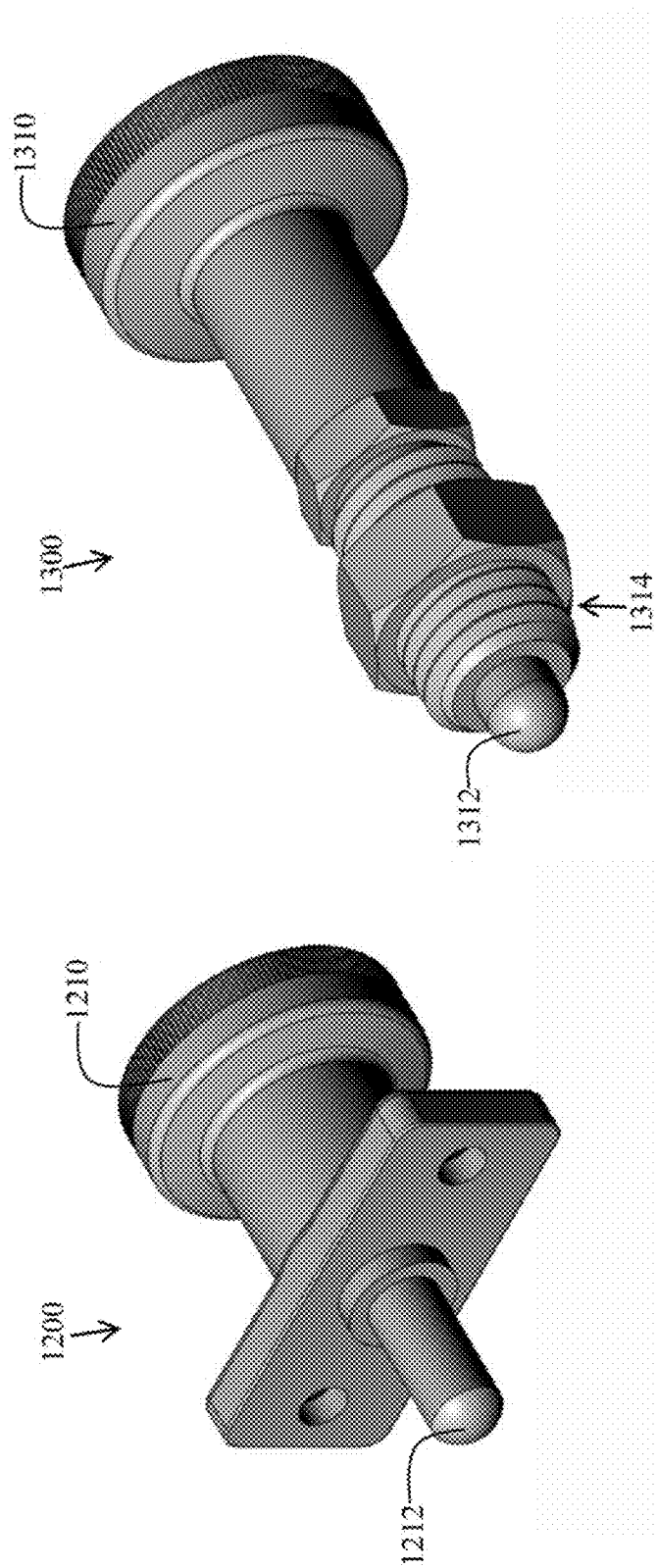

STANDING FRAME WITH MULTI-ANGLE POSITIONING WHILE MAINTAINING USER ORIENTATION

BACKGROUND

Standing aides provide people with disabilities or handicaps with many health and social benefits. Nevertheless, standing in one position for extended periods of time can increase fatigue and may not be amenable to various therapies.

SUMMARY

According to one embodiment, an apparatus includes a frame, where the frame includes a support member, a main member, and a pivot joint pivotably connecting the support member and the main member, and a support assembly connected to the support member for supporting a user, where the pivot joint allows the user to be positioned in one of a plurality of modes such as, for example, a supine mode, a standing mode, and a prone mode.

The descriptions of the embodiments do not limit the words used in the claims in any way or the scope of the claims. The words used in the claims have all of their full ordinary meanings.

BRIEF DESCRIPTION OF THE DRAWINGS

In the accompanying drawings, which are incorporated in and constitute a part of the specification, embodiments of the invention are illustrated, which, together with a general description of the invention given above, and the detailed description given below, serve to exemplify embodiments of this invention and highlight the structural and functional modality of the embodiments, including methods.

FIG. 8A is a perspective view of another embodiment of a control assembly of an apparatus in an exemplary supine position;

FIG. 8B is a perspective view of another embodiment of a control assembly of an apparatus in an exemplary standing position;

FIG. 8C is a perspective view of another embodiment of a control assembly of an apparatus in an exemplary prone position;

FIG. 11A is a perspective view of another embodiment of a control assembly of an apparatus in an exemplary supine position;

FIG. 11B is a perspective view of another embodiment of a control assembly of an apparatus in an exemplary standing position;

FIG. 11C is a perspective view of another embodiment of a control assembly of an apparatus in an exemplary prone position;

FIG. 12 is a perspective view of one embodiment of a locking mechanism of an apparatus;

FIG. 13 is a perspective view of another embodiment of a locking mechanism of an apparatus;

DESCRIPTION OF EMBODIMENTS

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, circuits, devices and components, software, hardware, control logic, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure, however, such values and ranges are not to be construed in a limiting sense and are intended to be critical values or ranges only if so expressly stated. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention, the inventions instead being set forth in the appended claims. Descriptions of exemplary methods or processes are not limited to inclusion of all steps as being required in all cases, nor is the order that the steps are presented to be construed as required or necessary unless expressly so stated. Components described or shown as connected, mated, joined, etc. may also include various intermediate components.

Figure 1:
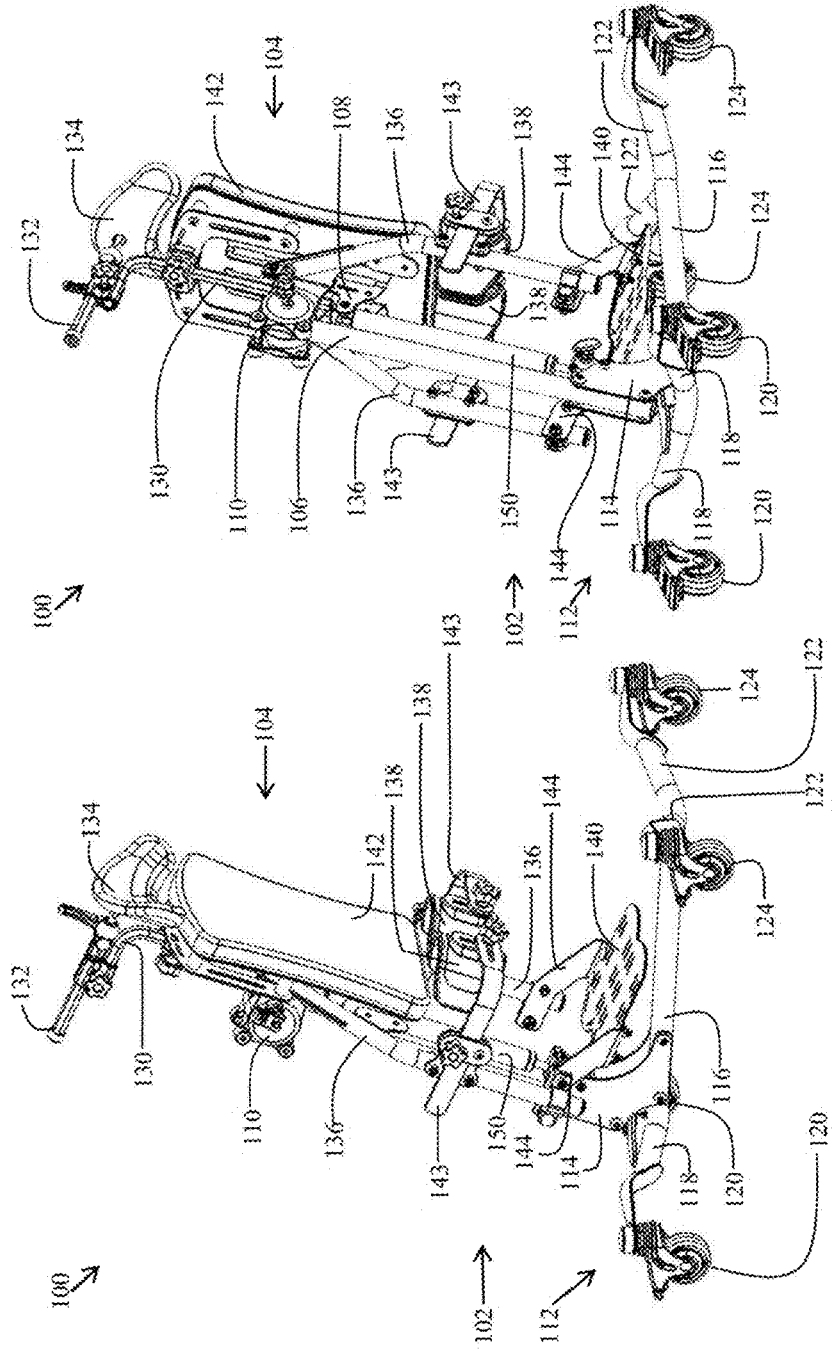
FIG. 1A is a front-side perspective view of one embodiment of an apparatus having multiple position modes.
FIG. 1B is a rear-side perspective view of one embodiment of an apparatus having multiple position modes.

FIGS. 1A and 1B illustrate front-side and rear-side perspective views, respectively, of one embodiment of an apparatus 100 having multiple position modes. Exemplary apparatus 100 includes a frame 102 and a support assembly 104. The exemplary frame 102 includes a main member 106, a support member 108, a pivot joint 110, and a base assembly 112. The support member 108 can be connected to the support assembly 104, which supports a user. The pivot joint 110 pivotably connects the support member 108 and the main member 106 for positioning the user into various positions.

In this embodiment, the exemplary base assembly 112 includes a base bracket 114, base support 116, supports 118 for rear wheels 120, and supports 122 for front wheels 124. A base assembly 112 with wheels allows the apparatus 100 to be mobile for convenient movement of the apparatus 100 and/or user. In other embodiments, the base assembly 112 may be fixed or stationary.

In this embodiment, the exemplary support assembly 104 includes a support frame 130, a support post 132 for a head support 134, lower supports 136 for knee and/or leg supports 138 and a footrest carrier 140, and a body support 142. Support post 132 is variably positional on support frame 130 through a clamp to accommodate varying user sizes. Support post 132 may also include a pivot point to adjust the position of head support 134 relative to the user's head. Knee and/or leg supports 138 include support brackets 143 that include slots or apertures for variable positioning of the knee and/or leg supports 138. Footrest carrier 140 includes associated brackets 144. Footrest brackets 144 are variably positional on lower supports 136 through clamps to accommodate varying user lengths and dimensions. Similarly, footrest carrier 140 may be variably positional on brackets 144 to also accommodate varying user dimensions.

The head support 134, knee and/or leg supports 138, body support 142, and/or any other supports may also include cushions for user comfort and/or to minimize pressure points. Various other supports (not shown) may also be incorporated with the support assembly 104, including, for example, an additional (opposite) body support, a body vest, body strap(s), head strap(s), other straps, restraints, belts, positioning pads, etc. The use of various supports to support a user may be based on several factors, including, for example, the position of the user and the physical capabilities of the user. Also, more than the illustrated number of supports (e.g., knee and/or leg) can be used.

Apparatus 100 also includes, for example, actuator 150 to assist movement, control movement, and/or limit movement. Actuator 150 can be passive (manual), mechanical (e.g., spring), pneumatic (i.e., gas), hydraulic (i.e., oil), electric, a damper, a braking system, etc., or combinations thereof. In some embodiments, actuator 150 may be controlled with a controller (e.g, electrically or manually). A force applied to an actuator controller can activate actuator 150 to assist in changing the relative position of the main member 106 and the support member 108 about the pivot joint 110, which allows the apparatus 100 to change positions throughout supine, standing, and prone modes, as described in more detail below (e.g., FIGS. 2-4).

In some embodiments, the actuator 150 is releasably attached, for example, to the main member 106, base bracket 114, and/or the support member 108. In some embodiments, the actuator 150 may be used to assist the relative movement of the main member 106 and the support member 108 about the pivot joint 110 for certain position ranges and not used or disconnected for other position ranges. In yet other embodiments, the actuator 150 may act as a movement assist device and/or a locking mechanism, as described in more detail below. In one embodiment, the actuator 150 may include a telescoping feature that may be held in place through apertures and a releasable detent mechanism to control the relative movement of the main member 106 and the support member 108 about the pivot joint 110.

Apparatus 100 allows for positioning a user in a plurality of modes including, for example, a supine mode, a standing mode, a prone mode, and various other modes in between these modes or positions. The embodiment shown in FIGS. 1A and 1B shows apparatus 100 as an exemplary stander, but the features of apparatus 100 may also be implemented into a tilt table and/or other medical platforms to achieve a degree of prone positioning along with supine positioning.

As shown, apparatus 100 is a multi-positional stander that does not need to be re-configured in order for the user to be positioned in prone and supine positions. In particular, the user does not need to be withdrawn from the apparatus 100 for a reconfiguration of the apparatus 100 or to be moved to a different apparatus to accommodate a different position for the user. The re-configuration of an apparatus to switch from a supine position capability to a prone position capability or vice-versa typically involves the changeover of apparatus components to support the user in the new position and the removal of the user from the apparatus so that the user can be rotated 180° to face the opposite direction. By using the embodiments herein that avoid or minimize transfers and/or reconfigurations, the user experiences less stress, the user has greater positional ability, and the safety risk associated with re-configuring an apparatus or the user being transferred from one apparatus to another is eliminated. For a caregiver, less time and work is involved with properly positioning the user (patient) and results in better utilization of equipment.

In some embodiments, if necessary, various surfaces of the apparatus 100 can be changed to make the apparatus 100 more suitable to the user lying generally "face-down" (prone) or "face-up" (supine), but without removing or rotating the user 180° to face the opposite direction. In other words, the apparatus 100 could be used as a prone stander, a supine stander, or both, with varying degrees depending on the arrangement and type of supportive upholstery pads and other options. In all cases, it is a necessary practice to secure the patient in the stander with appropriate restraints, belts, straps, or support vests. The anticipated therapeutic position that the user will be placed in plays a large part in the determination of the extent and specific type of support/restraint that will be employed by the therapist or other medical professional. However, as mentioned above, the apparatus 100 is able to achieve these positions without re-configuration of the apparatus 100 or rotation of the user.

In one embodiment, apparatus 100 operates as a supine stander, but contains mechanical features that allow the user support system to over-range beyond the vertical (standing fully upright) position and position the user up to a certain number of degrees beyond vertical (prone). In one embodiment, the user can be positioned up to 20° past vertical in a prone position. Other embodiments may be limited to a more or less prone position.

Referring again to FIGS. 1A and 1B, the base assembly 112, the main member 106 of the frame 102, and the pivot joint 110 act as the foundation of the apparatus 100. The support assembly 104 is attached to the pivot joint 110 and includes the various supports, upholstery pads, and/or other supportive accessories to provide a stable area for the user to be situated within when the user is at rest and/or during rotation about the pivot joint 110.

The position and rotating range of the apparatus 100 and the pivot joint 110 may be controlled by various control assemblies or devices, such as, for example, actuators, guides, lock assemblies, locking mechanisms, mechanical stops, interference points, range limiters, and the like. The full range of the apparatus 100 and the pivot joint 110 may be controlled by one or more of these devices. In some embodiments, a portion of the full range, or sub-range, of the apparatus 100 and the pivot joint 110 may be controlled by a first device and another portion of the full range may be controlled by a second device, operated separately or in combination with the first device.

Figure 2:
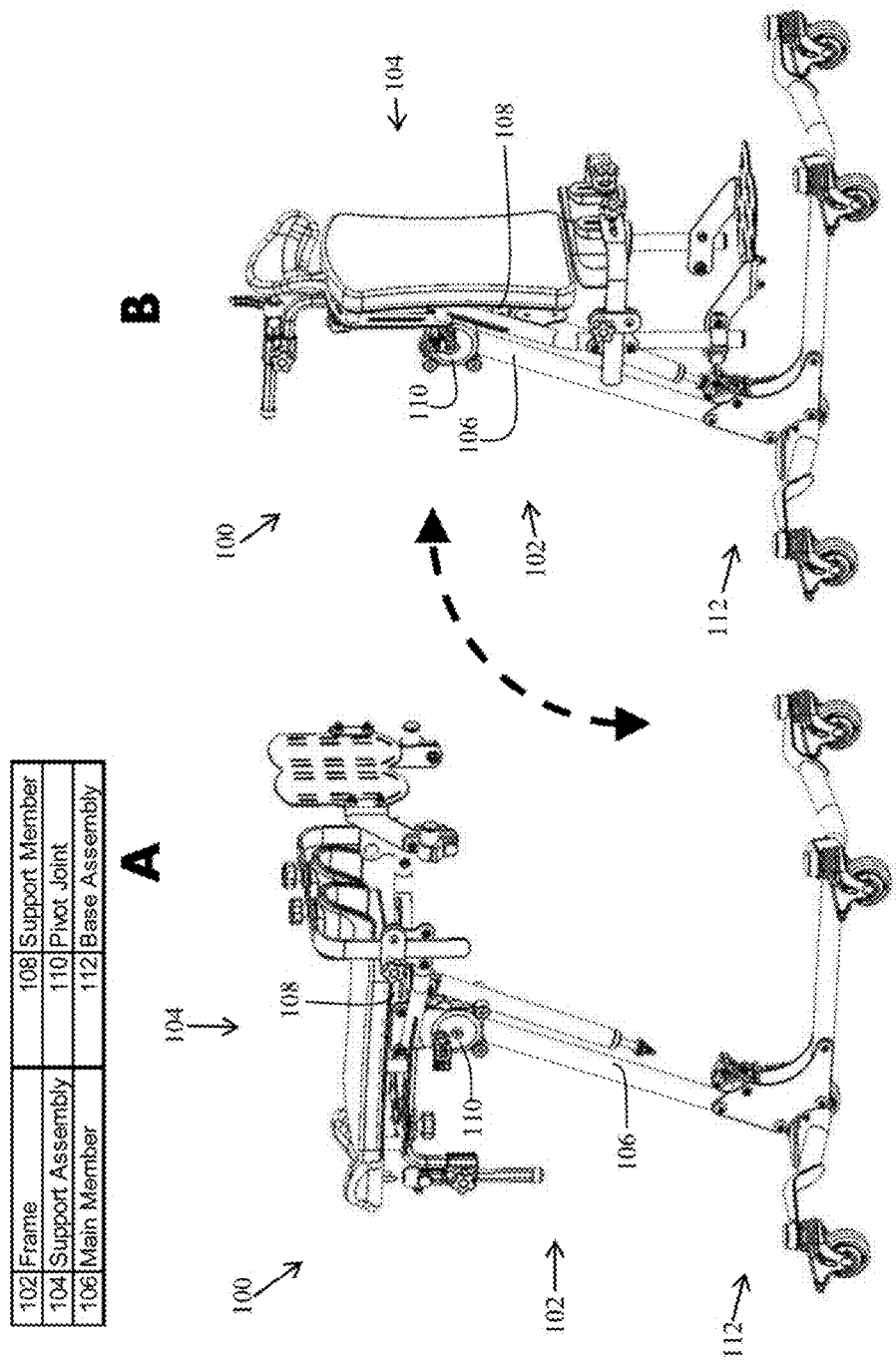
FIG. 2 shows perspective views of one embodiment of an apparatus in an exemplary supine position and an exemplary standing position.
Figure 3:
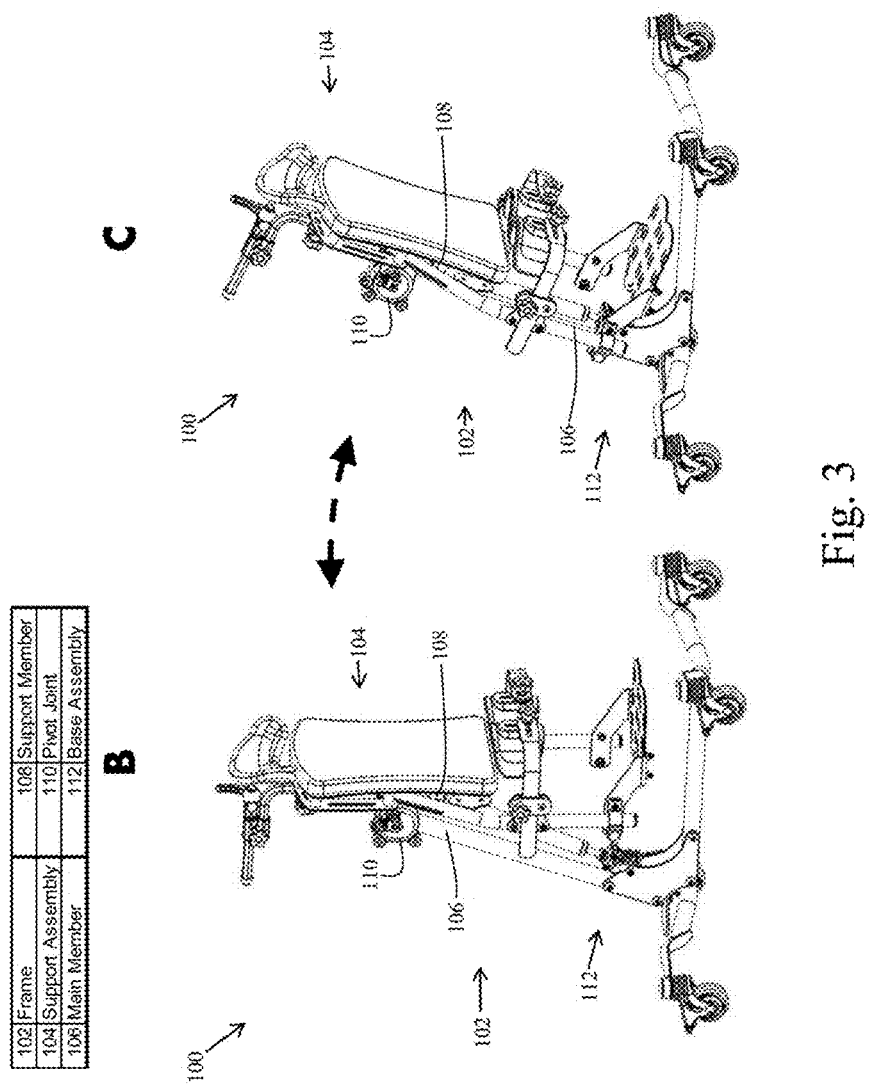
FIG. 3 shows perspective views of one embodiment of an apparatus in an exemplary standing position and an exemplary prone position.
Figure 4:
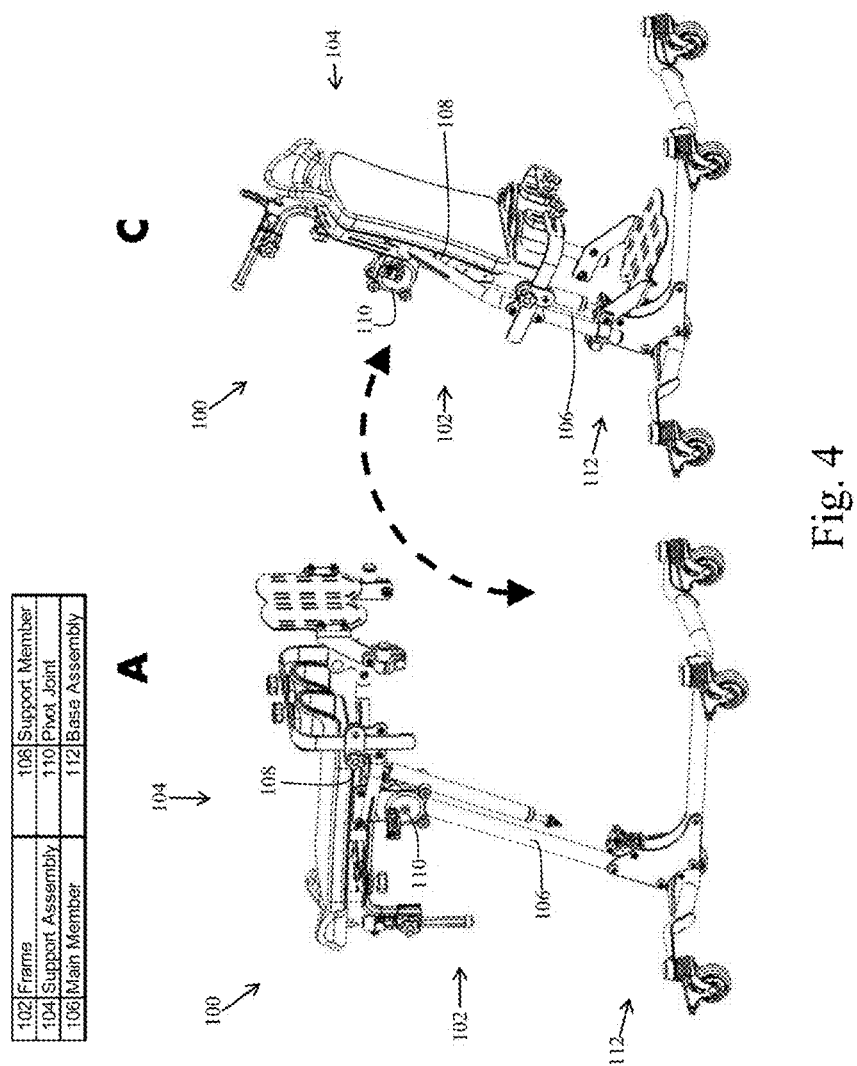
FIG. 4 shows perspective views of one embodiment of an apparatus in an exemplary supine position and an exemplary prone position.

Referring now to FIGS. 2-4, perspective views of several exemplary positions of the apparatus 100 are shown as part of exemplary operating ranges of the apparatus 100. In FIG. 2, the apparatus 100 is shown in position A, an exemplary supine position, and position B, an exemplary standing position. The dashed line shows the movement of the support member 108 of the support assembly 104 about the pivot joint 110 relative to the main member 106 of the frame 102 between positions A and B. In FIG. 3, the apparatus 100 is shown in position B, an exemplary standing position, and position C, an exemplary prone position. The dashed line shows the movement of the support member 108 of the support assembly 104 about the pivot joint 110 relative to the main member 106 of the frame 102 between positions B and C. In FIG. 4, the apparatus 100 is shown in position A, an exemplary supine position, and position C, an exemplary prone position. The dashed line shows the movement of the support member 108 of the support assembly 104 about the pivot joint 110 relative to the main member 106 of the frame 102 between positions A and C.

Apparatus 100 can position a user in a range from a supine position (A) to a prone position (C), along with several intermediate positions in between (e.g., B), without re-configuration of the apparatus 100 or rotation of the user. Positions A, B, and C are exemplary; the apparatus 100 is not limited to any specific supine, standing, or prone position. For example, in other embodiments, the apparatus 100 may have a range that extends beyond a supine position that is horizontal, providing a position where the user's head is at a vertical height below the height of the user's feet. In yet other embodiments, the apparatus 100 may have a range that extends to a further prone position, providing a position where the user's head is at a vertical height closer to the height of the user's feet. As mentioned above, depending on the desired position, suitable supports and/or restraints may be employed to properly position the user in the apparatus 100. However, the apparatus 100 is able to achieve supine and prone positions without re-configuration of the apparatus 100 or rotation of the user.

The ranges of the apparatus 100 shown in FIGS. 2-4 may be controlled by one or more control assemblies or devices, including the devices mentioned above. For example, the range shown in FIG. 2, from supine to standing, may be controlled by a first device and the range shown in FIG. 3, from standing to prone, may be controlled by a second device, operated separately or in combination with the first device. In another embodiment, the full range shown in FIG. 4, from supine to prone, may be controlled by one device.

Figures 5A, 5B, 5C:
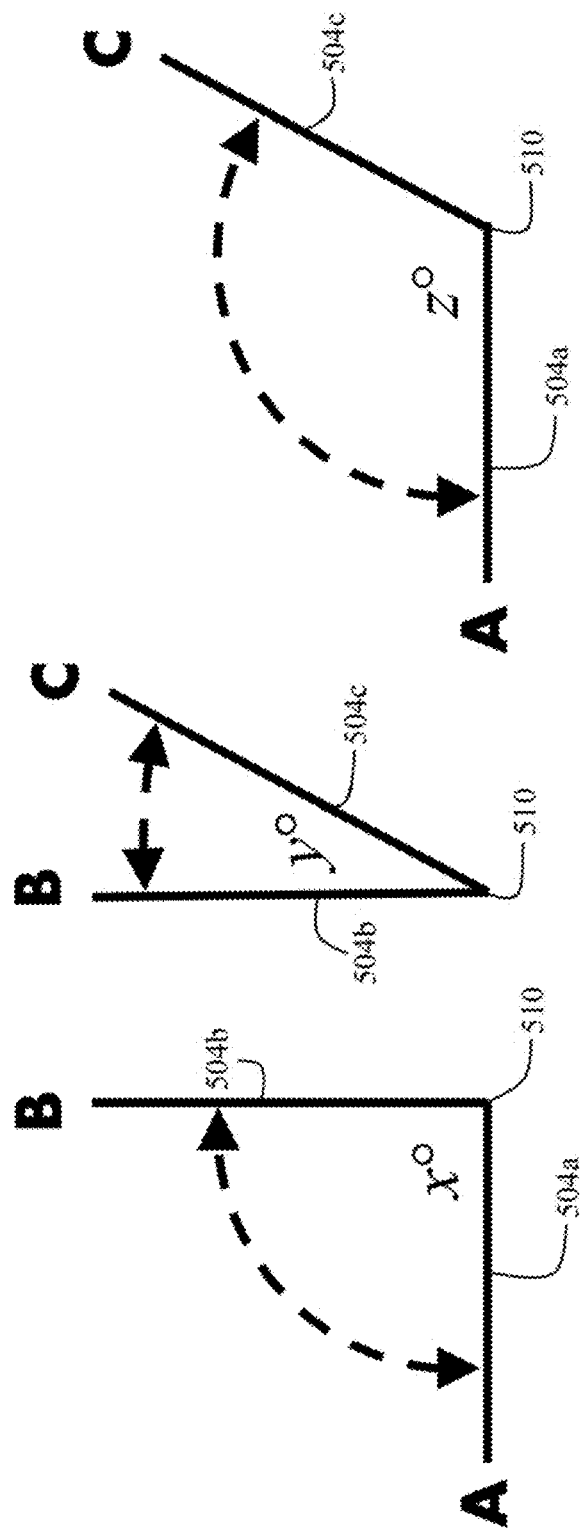
FIG. 5A is a drawing of an exemplary range between an exemplary supine position and an exemplary standing position in one embodiment of an apparatus.
FIG. 5B is a drawing of an exemplary range between an exemplary standing position and an exemplary prone position in one embodiment of an apparatus.
FIG. 5C is a drawing of an exemplary range between an exemplary supine position and an exemplary prone position in one embodiment of an apparatus.

FIGS. 5A-5C are drawings that represent embodiments with exemplary ranges and positions associated with the ranges and positions A, B, and C of FIGS. 2-4. The dashed lines show the movement of a support assembly 504 about a pivot joint 510 between positions A, B, and C. FIG. 5A shows an exemplary range associated with FIG. 2, where the support assembly 504 is shown in position A (504a), a supine position, and position B (504b), a standing position. The range of angular movement between positions A and B is x°. In this embodiment, the range between positions A and B is shown as approximately 90°. FIG. 5B shows an exemplary range associated with FIG. 3, where the support assembly 504 is shown in position B (504b), a standing position, and position C (504c), a prone position. The dashed line shows the movement of the support assembly 504 about the pivot joint 510 between positions B and C. The range of angular movement between positions B and C is y°. In this embodiment, the range between positions B and C is shown as approximately 20°. FIG. 5C shows an exemplary range associated with FIG. 4, where the support assembly 504 is shown in position A (504a), a supine position, and position C (504c), a prone position. The dashed line shows the movement of the support assembly 504 about the pivot joint 510 between positions A and C. The range of angular movement between positions A and C is z°. In this embodiment, the range between positions A and C is shown as approximately 110°. Support assembly 504 and pivot joint 510 represent exemplary position and range embodiments of the support assembly 104 and pivot joint 110 shown in FIGS. 1A and 1B.

Various control assemblies or devices may control the movement of the support assembly 504 within its range(s). For example, one device may control the support assembly 504 within its full range (z°), as shown in FIG. 5C, from supine to prone modes. In another embodiment, one device may control the support assembly 504 within a first range (x°), as shown in FIG. 5A, from supine to standing modes, and another device may control the support assembly 504 within a second range (y°), as shown in FIG. 5B, from standing to prone modes, alone or in combination with the first device.

Figure 6B:
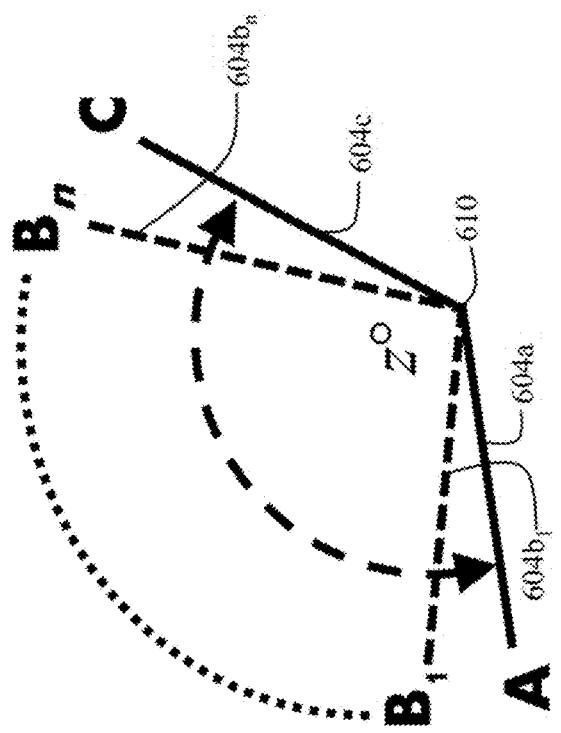
FIG. 6B is a drawing of an exemplary range between an exemplary supine position and an exemplary prone position with various exemplary intermediate positions in one embodiment of an apparatus.
Figure 6A:
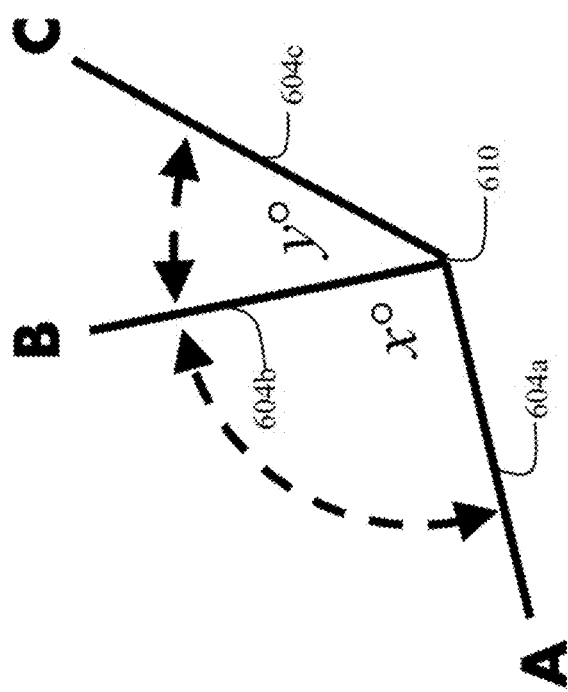
FIG. 6A is a drawing of an exemplary range between an exemplary supine position and an exemplary prone position with an exemplary intermediate position in one embodiment of an apparatus.

In other embodiments, positions A, B, and C may be various other positions and x, y, and z may be various other ranges. FIGS. 6A and 6B are drawings that represent embodiments with other exemplary ranges and positions. The dashed lines show the movement of a support assembly 604 about a pivot joint 610 between other positions A, B, and C. For example, FIG. 6A shows support assembly 604 in position A (604a), a supine position beyond horizontal, in position C (604c), a prone position, and in position B (604b), an arbitrary intermediate position, close to a standing position. The range of angular movement between positions A and B is x°. The range of angular movement between positions B and C is y°. FIG. 6B shows exemplary support assembly 604 with position A (604a) and position C (604c) as the limits of a range of z°. Position B (604b) is shown with support assembly (604$b_1$ through 604$b_n$) in a range of intermediate positions $B_1$ through $B_n$. In one embodiment, intermediate positions $B_1$ through $B_n$ are a series of incremental or discreet positions. In another embodiment, intermediate positions $B_1$ through $B_n$ are a series of infinite positions. Support assembly 604 and pivot joint 610 represent exemplary position and range embodiments of the support assembly 104 and pivot joint 110 shown in FIGS. 1A and 1B.

In any of these embodiments, the various control assemblies that control the relative position of the support assembly 104, 504, 604 to the frame 102 of the apparatus 100 may lock the support assembly 104, 504, 604 into various discreet or infinite positions within the exemplary ranges of the apparatus 100. The apparatus 100 may include one or more control assemblies. Each control assembly may include locking devices and/or range limiters. In some embodiments, each control assembly is associated with a positional range of the apparatus 100. The control assemblies typically include two or more engagement devices that can engage each other to lock the apparatus 100 into a particular position and/or limit the range of the apparatus 100, including the various positions and ranges mentioned above. The control assembly may be a separate device or may be incorporated into one or more of the components of the apparatus 100. For example, in some embodiments, control assemblies may be incorporated into the actuator 150 and/or the pivot joint 110.

Figures 7A, 7B, 7C:
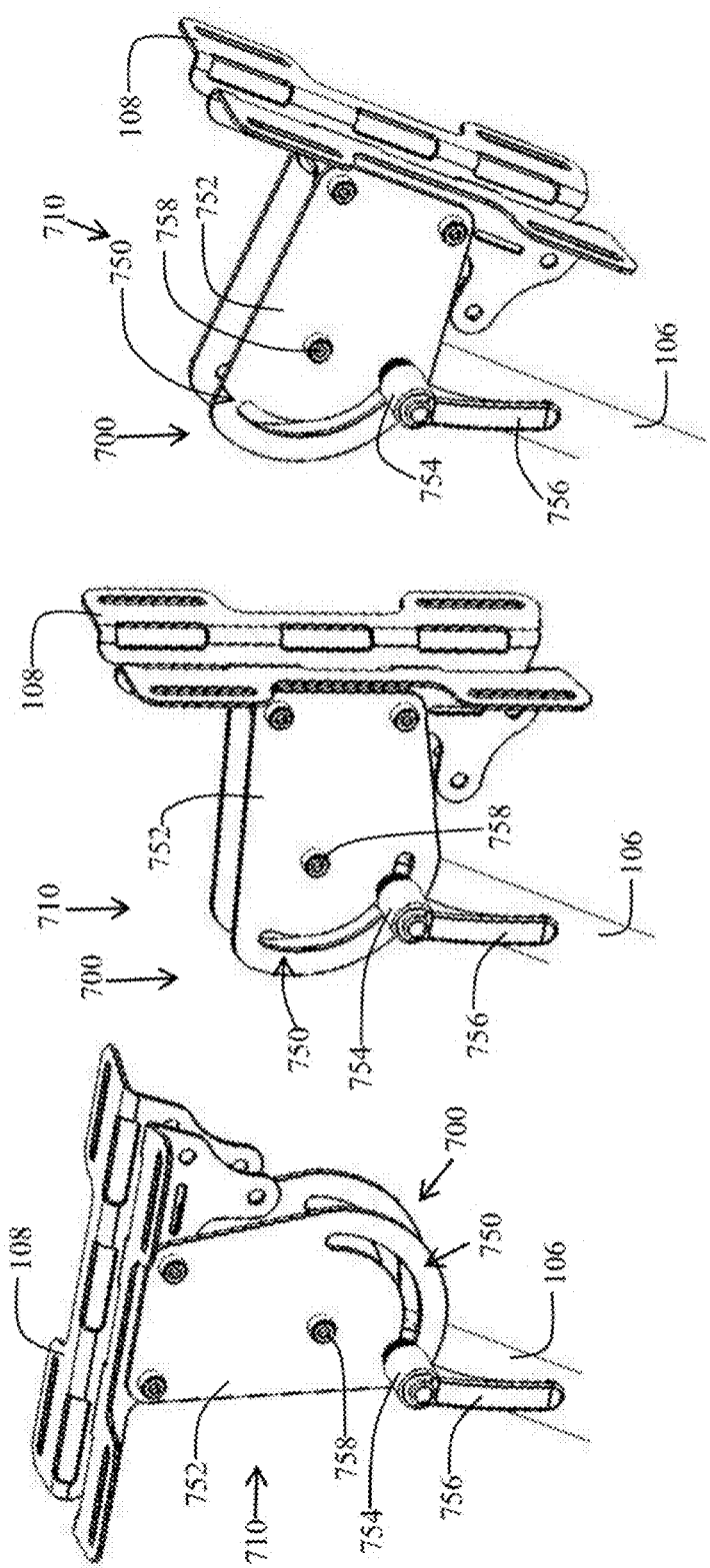
FIG. 7A is a perspective view of one embodiment of a control assembly of an apparatus in an exemplary supine position.
FIG. 7B is a perspective view of one embodiment of a control assembly of an apparatus in an exemplary standing position.
FIG. 7C is a perspective view of one embodiment of a control assembly of an apparatus in an exemplary prone position.

In one embodiment, FIGS. 7A-7C show perspective views of an exemplary control assembly 700 that may be incorporated with the pivot joint 110 shown in FIGS. 1A and 1B, shown here as pivot joint 710. Control assembly 700 functions as a range limiter and a locking device. The pivot joint 710 pivotably connects the support member 108 and the main member 106 for positioning the user into various positions by controlling the relative angular position of the support member 108 and the main member 106. The control assembly 700 includes an arcuate slot 750 in one or more brackets 752, a shaft that extends through the arcuate slot 750 and the main member 106, a locking mechanism 754, and a lever 756 for actuating the locking mechanism 754. In this embodiment, the locking mechanism 754 is used to lock the position of the bracket 752 about the shaft that extends through the arcuate slot 750 and the main member 106. However, the locking mechanism 754 may be any device that engages the bracket 752 with the main member 106, including, for example, a clamping mechanism passing through the arcuate slot 750 with a lever that can be released to change positions, a screw-type mechanism passing through the arcuate slot 750 that can be unscrewed to change positions, or the like. In other embodiments, a guide may protrude through the arcuate slot 750 and the locking mechanism 754 may engage the bracket 752 with the main member 106 outside of the arcuate slot 750.

When the control assembly 700 is unengaged, the pivot joint 710 is free to rotate about a pivot shaft 758 of the pivot joint 710, changing the relative position of the support member 108 and the main member 106, which controls the position of the support assembly 104 and the user. When the control assembly 700 is engaged, the pivot joint 710 is locked into a particular relative position of the support member 108 and the main member 106.

In this embodiment, the control assembly 700 provides for an infinite number of positions within the range established by the characteristics of the arc in arcuate slot 750 such as, for example, its length. The arc's shape including, for example, curvature, can also specify the range and positions therein. The exemplary range established by the arcuate slot 750 extends from supine to prone positions, similar to the ranges shown in FIGS. 4 and 5C. FIG. 7A shows pivot joint 710 with the control assembly 700 locked in an exemplary supine position, which may be associated with position A shown in FIGS. 2-5C. FIG. 7B shows pivot joint 710 with the control assembly 700 locked in an exemplary standing position, which may be associated with position B shown in FIGS. 2-5C. FIG. 7C shows pivot joint 710 with the control assembly 700 locked in an exemplary prone position, which may be associated with position C shown in FIGS. 2-5C.

In another embodiment, FIGS. 8A-8C show perspective views of an exemplary control assembly 800 that may be incorporated with the pivot joint 110 shown in FIGS. 1A and 1B, shown here as pivot joint 810. Control assembly 800 functions as a range limiter and a locking device. The pivot joint 810 pivotably connects the support member 108 and the main member 106 for positioning the user into various positions by controlling the relative angular position of the support member 108 and the main member 106. The control assembly 800 includes an arcuate arrangement of holes 850 in one or more brackets 852, a shaft that extends through one of the arcuate arrangement of holes 850 and the main member 106, a locking mechanism 854, and a handle 856 for inserting the locking mechanism 854 into one of the arcuate arrangement of holes 850. In this embodiment, the locking mechanism 854 is used to lock the position of the bracket 852 about the shaft that extends through one of the arcuate arrangement of holes 850. However, the locking mechanism 854 may be any device that engages one of the arcuate arrangement of holes 850 in the bracket 852 with the main member 106, including, for example, a spring-loaded button attached to the main member 106 that can be depressed to change positions, a shaft that extends through one of the arcuate arrangement of holes 850 in the bracket 852 and a hole in the main member 106 that can be removed to change positions, or the like.

When the control assembly 800 is unengaged, the pivot joint 810 is free to rotate about a pivot shaft 858 of the pivot joint 810, changing the relative position of the support member 108 and the main member 106, which controls the position of the support assembly 104 and the user. When the control assembly 800 is engaged, the pivot joint 810 is locked into a particular relative position of the support member 108 and the main member 106.

In this embodiment, the control assembly 800 provides for a discrete number of positions within the range established by the arc length of the arcuate arrangement of holes 850. These holes are shown evenly spaced, but in other embodiments, the holes may not be evenly spaced. The exemplary range established by the arcuate arrangement of holes 850 extends from supine to prone positions, similar to the ranges shown in FIGS. 4 and 5C. FIG. 8A shows pivot joint 810 with the control assembly 800 locked in an exemplary supine position, which may be associated with position A shown in FIGS. 2-5C. FIG. 8B shows pivot joint 810 with the control assembly 800 locked in an exemplary standing position, which may be associated with position B shown in FIGS. 2-5C. FIG. 8C shows pivot joint 810 with the control assembly 800 locked in an exemplary prone position, which may be associated with position C shown in FIGS. 2-5C.

Figure 9B:
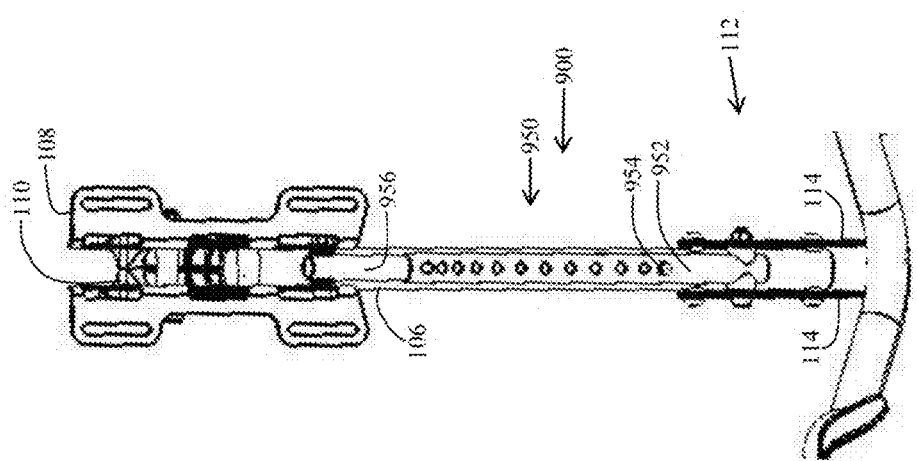
FIG. 9B is a front perspective view of another embodiment of a control assembly of an apparatus in an exemplary prone position.
Figure 9A:
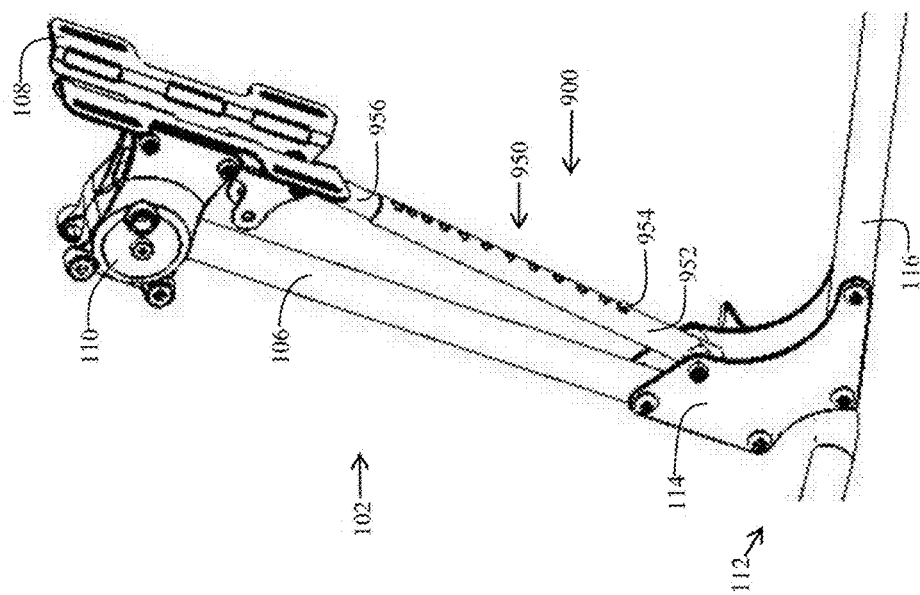
FIG. 9A is a front-side perspective view of another embodiment of a control assembly of an apparatus in an exemplary prone position.

In yet another embodiment, FIGS. 9A and 9B show perspective views of an exemplary control assembly 900 that is separate from the pivot joint 110. Control assembly 900 functions as a range limiter and a locking device. In some embodiments, control assembly 900 may be incorporated with the actuator 150 shown in FIGS. 1A and 1B. The pivot joint 110 pivotably connects the support member 108 and the main member 106 and the control assembly 900 connects to the support member 108 and base bracket 114, which is connected to the main member 106. In this manner, the control assembly 900 controls positioning the user into various positions by controlling the relative angular position of the support member 108 and the main member 106. The control assembly 900 includes a linear arrangement of holes 950 in a first tube 952, a locking mechanism 954 that extends through one of the linear arrangement of holes 950, and a second tube 956 at least partially within the first tube 952 for supporting or engaging with the locking mechanism 954. The locking mechanism 954 may be any device that engages the first tube 952 with the second tube 956, including, for example, a spring-loaded button attached to the second tube 956 that can be depressed to change positions, a shaft that extends through one of the linear arrangement of holes 950 in a first tube 952 and a hole in the second tube 956 that can be removed to change positions, or the like.

When the control assembly 900 is unengaged, the pivot joint 110 is free to rotate about a pivot shaft of the pivot joint 110, changing the relative position of the support member 108 and the main member 106, which controls the position of the support assembly 104 and the user. As the pivot joint 110 rotates, the second tube 956 moves telescopically within the first tube 952. When the control assembly 900 is engaged, the pivot joint 110 is locked into a particular relative position of the support member 108 and the main member 106.

In this embodiment, the control assembly 900 provides for a discrete number of positions within the range established by the length of the linear arrangement of holes 950. These holes may be evenly or unevenly spaced. The exemplary range established by the linear arrangement of holes 950 extends from supine to prone positions, similar to the ranges shown in FIGS. 4 and 5C. FIG. 9A shows pivot joint 110 with the control assembly 900 locked in an exemplary prone position, which may be associated with position C shown in FIGS. 2-5C. FIG. 9B shows a front view in the same position.

Figure 10:
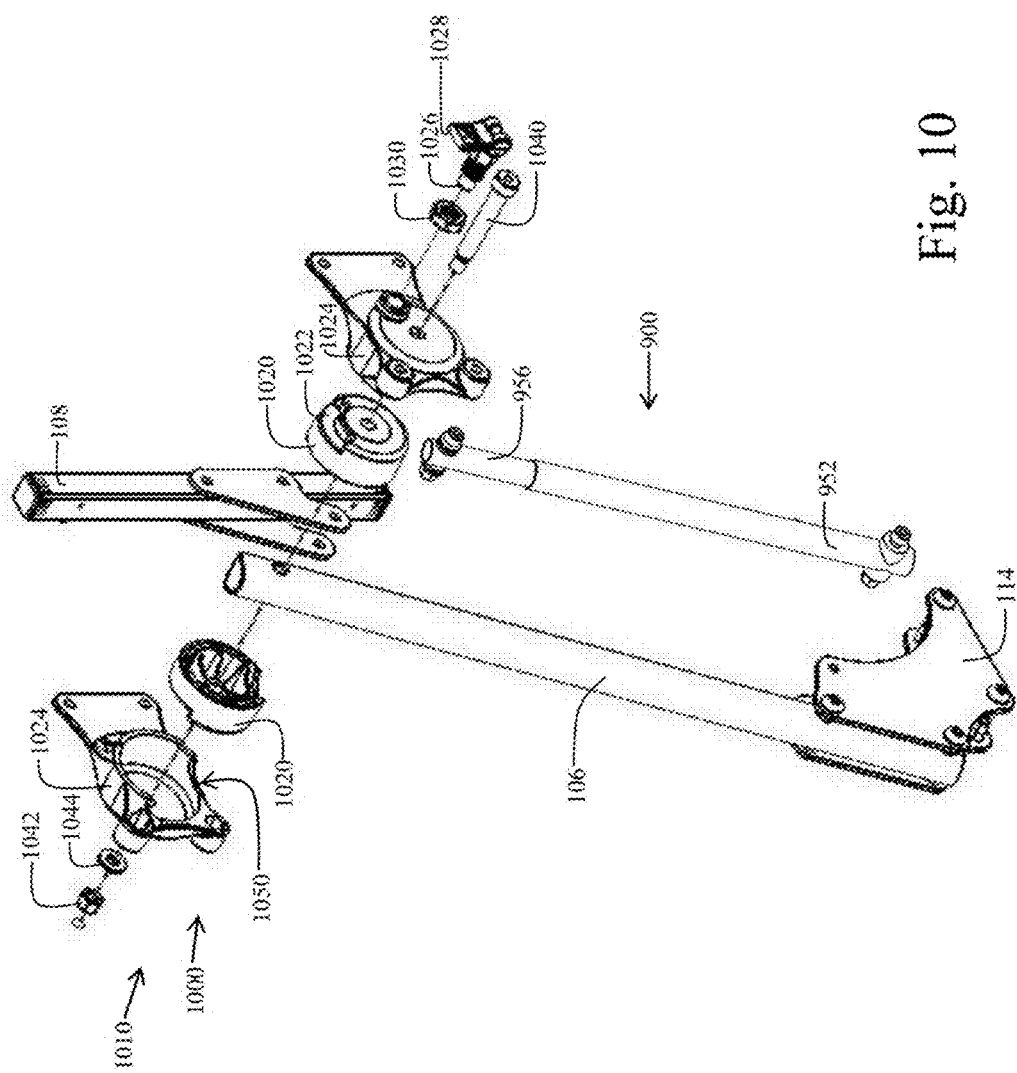
FIG. 10 is an exploded perspective view of another embodiment of an exemplary control assembly of an apparatus.

In other embodiments, a control assembly may be used to control movement of the apparatus 100 within a limited range or a sub-range. For example, FIG. 10 shows an exploded perspective view of an exemplary control assembly 1000 that may be incorporated with the pivot joint 110 shown in FIGS. 1A and 1B, shown here as pivot joint 1010. Control assembly 1000 functions as a range limiter and is shown in combination with control assembly 900 that functions as a range limiter and a locking device. In other embodiments, control assembly 1000 can be used with any other control assembly, including other locking devices, such as, for example, control assemblies 700, 800. However, in other embodiments, control assembly 1000 and/or other range limiters can be utilized without any other control assemblies.

The pivot joint 1010 pivotably connects the support member 108 and the main member 106 and the control assembly 900 connects to the support member 108 and base bracket 114, which is connected to the main member 106. In this manner, the control assembly 900 controls positioning the user into various positions by controlling the relative angular position of the support member 108 and the main member 106. As described in more detail above, the linear arrangement of holes 950 in the control assembly 900 determines the range of movement of the apparatus 100 from supine to prone modes. However, control assembly 1000 may also restrict the range of movement.

Exemplary control assembly 1000 includes one or more bushings 1020 that include an arcuate recess or slot 1022, housing 1024, plunger 1026 with actuation lever/tab 1028 or other mechanical means of stopping or containing the degree of rotation of the pivot joint 1010, and retaining nut 1030. Actuation of the lever/tab 1028 extends the plunger 1026 into the arcuate slot 1022 of the bushing 1020. The control assembly 1000 is configured around pivot shaft 1040, which is secured with retaining nut 1042 and washer 1044. The bushings 1020 are secured around the main member 106. The housing 1024 is secured to the support member 108. The plunger 1026 is secured to and moves with the housing 1024 and the support member 108 such that, when the plunger 1026 is extended into the arcuate slot 1022 of the bushing 1020, the movement of the support member 108 is limited to the range established by the arc length of the arcuate slot 1022, which is secured with the main member 106.

In this embodiment, the control assembly 900 has an exemplary range established by the linear arrangement of holes 950 that extends from supine to prone positions, similar to the ranges shown in FIGS. 4 and 5C. When the plunger 1026 is engaged into the arcuate slot 1022, control assembly 1000 has an exemplary range established by the arc length of the arcuate slot 1022 that extends from supine to standing positions, similar to the ranges shown in FIGS. 2 and 5A. In this manner, when the plunger 1026 is engaged into the arcuate slot 1022, the apparatus 100 is limited to movement from the supine to standing positions, which is not the full range of the control assembly 900; when the plunger 1026 is not engaged into the arcuate slot 1022, the apparatus 100 is limited to movement from the supine to prone positions, which is the full range of the control assembly 900.

The plunger 1026 or other mechanical means may be controllably activated to allow the pivot joint 1010 to exceed its pre-determined angle of rotation established by the arc length of the arcuate slot 1022, thereby allowing the apparatus 100 to exceed vertical (upright standing position) and be rotated into a forward leaning, or prone position, with or without further or additional adjustments to the supports for the user, and without removing the user from the apparatus 100. A final position dead-stop can be employed to provide an absolute maximum angle of rotation. In this embodiment, the maximum angle of rotation is controlled by the control assembly 900. In embodiments without another control assembly, the apparatus may be configured with a mechanical stop, such as a surface or an edge 1050 of the housing 1024 that can be designed to come into contact with the main member 106 at a certain angle of rotation of the support member 108.

In this embodiment, the control assembly 900 provides for a discrete number of positions within the range established by the length of the linear arrangement of holes 950 and within the sub-range established by the arc length of the arcuate slot 1022 when the plunger 1026 is engaged with the slot 1022. FIG. 11A shows pivot joint 1010 and the control assembly 1000 in an exemplary supine position with the plunger 1026 engaged by the tab 1028, which may be associated with position A shown in FIGS. 2-5C. FIG. 11B shows pivot joint 1010 and the control assembly 1000 in an exemplary standing position with the plunger 1026 engaged by the tab 1028, which may be associated with position B shown in FIGS. 2-5C. FIGS. 11A and 11B demonstrate the limits of an exemplary 90° range established by the control assembly 1000 when the plunger 1026 is engaged. FIG. 11C shows pivot joint 1010 and the control assembly 1000 in an exemplary prone position with the plunger 1026 not engaged by the tab 1028, which may be associated with position C shown in FIGS. 2-5C. In this configuration, the apparatus 100 may be locked into any available supine, standing, or prone position established by the linear arrangement of holes 950 in the control assembly 900. One or more other control assemblies, including locking assemblies, may also be used to control positions and ranges, including sub-ranges of the full range.

In operation, the control assembly 1000 may be used to prevent the apparatus 100 from moving into a prone position accidentally or before the user has been properly supported. For example, the tab 1028 for extending the plunger 1026 in and out of the arcuate slot 1022 of the bushing 1020 may be labeled with an appropriate warning or reminder to properly support the user before disengaging the plunger 1026 and moving the user into a prone position. While the plunger 1026 is engaged with the slot 1022, the prone position is unavailable even though the prone position is within the range of the control assembly 900. As can be appreciated, any combination of control assemblies may be utilized to establish various ranges and sub-ranges that have various range limits/positions, including, for example, those represented in FIGS. 5A-6B.

The plunger 1026 may be engaged with the arcuate slot 1022 using various locking mechanisms in addition to the plunger 1026 with toggle style tab 1028 embodiment shown in FIGS. 10 and 11. For example, FIGS. 12 and 13 show alternative locking mechanisms for extending a plunger or the like into a slot or the like. FIG. 12 shows an exemplary plunger 1200 with knob 1210 to push or pull plunger tip 1212 into engaged and unengaged positions. FIG. 13 shows an exemplary plunger 1300 with knob 1310 to twist plunger tip 1312 into engaged and unengaged positions along a helical path 1314. Any style two-position plunger that extends into engaged or unengaged positions may be used.

Figure 14:
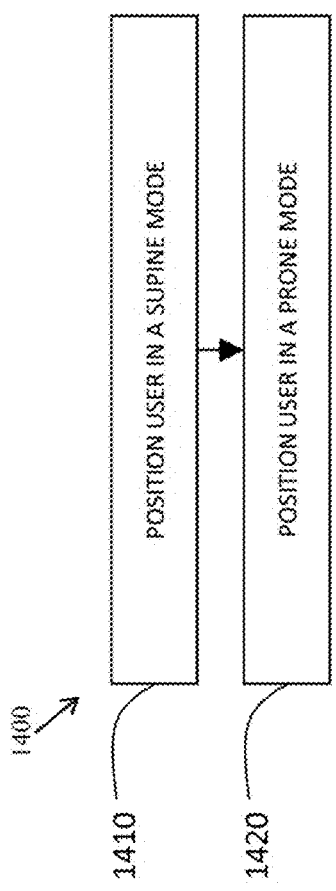
FIG. 14 is a flowchart of an exemplary embodiment of one method of operating an apparatus.
Figure 15:
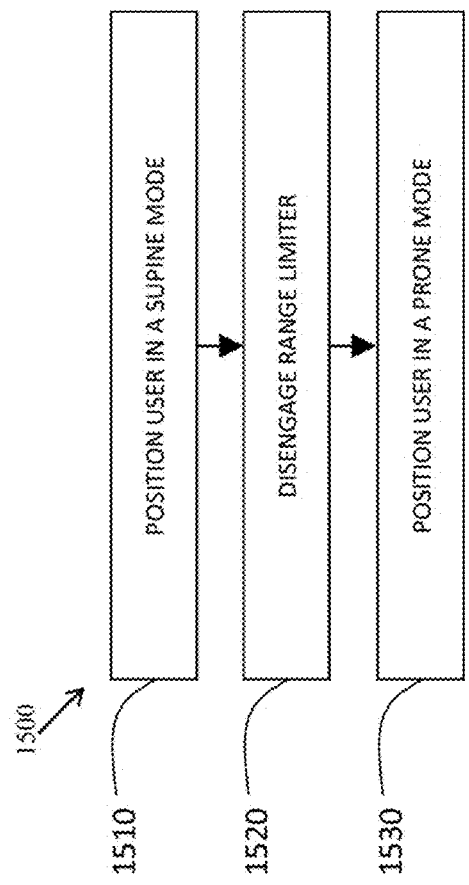
FIG. 15 is a flowchart of an exemplary embodiment of another method of operating an apparatus.

FIG. 14 is a flowchart of an exemplary embodiment of a method 1400 of operating apparatus 100. At step 1410, the user is positioned in a supine mode, which may be associated with position A shown in FIGS. 2-5C. At step 1420, the user is positioned in a prone mode, which may be associated with position C shown in FIGS. 2-5C. FIG. 15 is another flowchart of an exemplary embodiment of a method 1500 of operating apparatus 100. At step 1510, the user is positioned in a supine mode, which may be associated with position A shown in FIGS. 2-5C. At step 1520, a range limiter, such as, for example, the control assembly 1000 shown in FIG. 10, is disengaged to extend the range of the apparatus 100. At step 1530, the user is positioned in a prone mode, which may be associated with position C shown in FIGS. 2-5C.

While the present invention has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. For example, where a joint forms a common pivot for more then one component, separate joints can be implemented. Also, more or less component adjustability may be provided than in the illustrated examples. Furthermore, components such as assistive actuators may be eliminated entirely or supplemented by additional actuators (including powered and manual actuators). Still further, component geometries, shapes, and dimensions can be modified without changing the overall role or function of the components. Additionally, locking mechanisms can be in the form of clamps, locks, plungers, detents, and other similar type devices and pivots can be in the form of joints, hinges, swivels, wheels or similar type devices. Therefore, the inventive concept, in its broader aspects, is not limited to the specific details, the representative apparatus, and illustrative examples shown and described. Accordingly, departures may be made from such details without departing from the spirit or scope of the applicant's general inventive concept.

What is claimed:

1. A standing frame configured for multi-angle positioning of a user being supported by the standing frame, comprising:
   a frame, wherein the frame comprises:
      a support member;
      a main member; and
      a pivot joint pivotably connecting the support member and the main member, wherein a relative position of the support member and the main member has a range of greater than 90 degrees; and
   a support assembly connected to the support member configured for supporting a body of the user in a position and an orientation within the support assembly of the standing frame;
   wherein the pivot joint allows the user to be positioned in a supine position, a standing position, a prone position, and between any of these positions without changing the orientation of the user within the support assembly of the standing frame, and
   wherein the prone position allows the user to be positioned beyond a 90 degree vertical position when desired.

2. The standing frame of claim 1 further comprising a first control assembly configured for controlling the relative position of the support member and the main member to each other throughout a first range.

3. The standing frame of claim 2 wherein the first range limits the user to positions between and including the supine position and the prone position.

4. The standing frame of claim 2 wherein the first range limits the user to positions between and including the standing position and the prone position.

5. The standing frame of claim 2 further comprising a second control assembly configured for controlling the relative position of the support member and the main member to each other throughout a second range, wherein the first range and the second range overlap.

6. The standing frame of claim 2 wherein the first control assembly comprises:
   a first engagement device; and
   a second engagement device configured for engaging with the first engagement device;
   wherein the first engagement device is associated with one of the support member and the main member and the second engagement device is associated with the other one of the support member and the main member.

7. The standing frame of claim 6 wherein the relative position of the support member and the main member is limited to the first range when the first engagement device is engaged with the second engagement device and the relative position of the support member and the main member is extended into a second range when the first engagement device is not engaged with the second engagement device.

8. The standing frame of claim 7 wherein the first range limits user positions to those between and including the supine position and the standing position, and the second range allows the user to be positioned in the prone position when desired.

9. The standing frame of claim 6 wherein the first engagement device comprises a bracket including an arcuate slot and the second engagement device comprises a locking mechanism configured for extending through the arcuate slot and locking the support member and the main member into a relative position within the range of the arcuate slot.

10. The standing frame of claim 6 wherein the first engagement device comprises a bracket including an arcuate arrangement of holes and the second engagement device comprises a locking mechanism configured for extending through one of the holes and locking the support member and the main member into a relative position within the range of the arcuately-spaced holes.

11. The standing frame of claim 6 wherein the first engagement device comprises a first tube including a series of linearly-spaced holes and the second engagement device comprises a second tube including a locking mechanism configured for extending through one of the holes and locking the support member and the main member into a relative position within the range of the linearly-spaced holes.

12. The standing frame of claim 6 wherein the first engagement device comprises a bushing including an arcuate slot and the second engagement device comprises a locking mechanism extendable into the arcuate slot.

13. The standing frame of claim 12 wherein the relative position of the support member and the main member is limited to the first range when the locking mechanism is extended into the arcuate slot and the relative position of the support member and the main member is extended into a second range when the locking mechanism is not extended into the arcuate slot.

14. The standing frame of claim 13 wherein the first range limits user positions to those between and including the supine position and the standing position, and the second range allows the user to be positioned in the prone position when desired.

15. A method of positioning a user within a standing frame, where the standing frame is moveable into a supine mode, a prone mode, and modes in between, comprising:
supporting a body of the user placed in a position and an orientation within a support assembly of the standing frame;
positioning the user who is being supported within the support assembly of the standing frame in a supine position; and
then subsequently positioning the user into a prone position without changing the orientation of the user within the support assembly of the standing frame,
wherein the prone positioning of the standing frame allows the user to be positioned beyond a 90 degree vertical position when desired; and
wherein positioning the user comprises changing a relative position of a support member and a main member of the standing frame to each other via a pivot joint pivotably connecting the support member and the main member, and wherein the relative position of the support member and the main member has a range of greater than 90 degrees.

16. A standing frame configured for multi-angle positioning of a user being supported by the standing frame, where the standing frame is moveable into a supine mode, a prone mode, and modes in between, comprising:
a means for supporting a body of the user placed in a position and an orientation within the standing frame;
a means for positioning the user who is being supported within the means for supporting the body of the user in a supine position and configured for subsequently positioning the user into a prone position, wherein the prone positioning of the standing frame allows the user to be positioned beyond a 90 degree vertical position when desired;
wherein positioning the user comprises changing a relative position of the means for supporting the body of the user and the means for supporting the standing frame via a means for pivotably connecting the means for supporting the body of the user and the means for supporting the standing frame without changing the orientation of the user within the means for supporting the body of the user, and
wherein the relative position of the means for supporting the body of the user and the means for supporting the standing frame has a range of greater than 90 degrees.

17. The standing frame of claim 16 further comprising a first means for controlling the relative position of the means for supporting the body of the user and the means for supporting the standing frame.

18. The standing frame of claim 17 further comprising a second means for controlling the relative position of the means for supporting the body of the user and the means for supporting the standing frame, wherein the first means for controlling controls the relative position of the support member and the main member to each other throughout a first range and the second means for controlling controls the relative position of the support member and the main member to each other throughout a second range.

19. The standing frame of claim 18 wherein the first range limits user positions to those between and including the supine position and a standing position, and the second range allows the user to also be positioned in the prone position when desired.

* * * * *